United States Patent [19]

Kukanskis et al.

[11] Patent Number: 4,756,930
[45] Date of Patent: * Jul. 12, 1988

[54] PROCESS FOR PREPARING PRINTED CIRCUIT BOARD THRU-HOLES

[75] Inventors: Peter E. Kukanskis, Woodbury; Harold L. Rhodenizer, Bethlehem, both of Conn.

[73] Assignee: MacDermid, Incorporated, Waterbury, Conn.

[*] Notice: The portion of the term of this patent subsequent to Jul. 1, 2003 has been disclaimed.

[21] Appl. No.: 877,241

[22] Filed: Jun. 23, 1986

Related U.S. Application Data

[63] Continuation of Ser. No. 759,590, Jul. 26, 1985, Pat. No. 4,597,988, which is a continuation of Ser. No. 501,295, Jun. 6, 1983, abandoned.

[51] Int. Cl.$^4$ .................. B05D 5/12; B05D 3/01; B05D 3/10; B29C 37/00
[52] U.S. Cl. .................................. 427/97; 427/98; 427/306; 427/307; 156/645; 156/668
[58] Field of Search ............... 427/97, 98, 304, 443.1; 156/645, 668

[56] References Cited

U.S. PATENT DOCUMENTS

| | | | |
|---|---|---|---|
| 3,725,108 | 4/1973 | Saubestre | 427/98 |
| 3,865,623 | 2/1975 | Allen | 427/98 |
| 4,054,693 | 10/1977 | Leech | 427/304 |
| 4,425,380 | 1/1984 | Nuzzi | 427/97 |
| 4,515,829 | 5/1985 | Deckert | 427/97 |
| 4,597,988 | 7/1986 | Kukanskis | 427/97 |

OTHER PUBLICATIONS

Kukanskis, "Improved Smear Removal", Circuits Manufacturing, pp. 73, 74, Mar. 1983.
Blanchette et al., "Smear Removal from Drilled Printed Circuit Boards", IBM TDB, vol. 23, No. 10, Mar. 1981.

*Primary Examiner*—Norman Morgenstern
*Assistant Examiner*—Margaret Burke
*Attorney, Agent, or Firm*—St. Onge, Steward, Johnston & Reens

[57] ABSTRACT

The thru-holes of a multilayer printed circuit board, comprised of a laminate of epoxy resin and metal innerlayers, are provided with a conductive metal coating by a process in which the holes are first subjected to a desmearing process to remove smear from the copper innerlayers, followed by treatment of the hole surfaces with a solvent for the resin, treatment of the hole surfaces with a highly alkaline permanganate solution, and deposition of a conductive metal layer on the hole surfaces.

7 Claims, 4 Drawing Sheets

4C 2,000X   STEEP DOWN HOLE 4,000 A 45°

PROCESS FOR PREPARING PRINTED CIRCUIT BOARD THRU-HOLES

This is a continuation of co-pending application Ser. No. 759,590 filed on July 26, 1985, now U.S. Pat. No. 4,597,988, which in turn is a continuation of application Ser. No. 501,295, filed June 6, 1983, now abandoned.

BACKGROUND OF THE INVENTION (1) Field of the Invention

Multilayer printed circuit boards typically made of epoxy glass resin with copper innerlayers having drilled thru-holes are well known. The present invention relates to preparing these drilled holes for the application of the conductive metal, usually electrolessly plated copper, and more specifically, relates to chemically treating the surface of the thru-holes to increase its effective surface area to provide improved coverage of the metal deposited on the surface.

(2) Description of the Prior Art

Thru-holes in printed circuit boards must have adequate and uniform copper coverage to provide a good electrically conductive surface. A blistered, voided or flaked appearance on the plated hole wall shows lack of metal coverage of the copper on the substrate. Several steps are necessary to prepare drilled thru-holes for reception of the electroless metal.

During the drilling of thru-holes in a printed circuit board comprising epoxy resin and copper multilayers, resin can be smeared over the copper innerlayers, and, if the holes are left untreated prior to copper deposition on the hole well, a dielectric barrier will be left between the conductive path of applied copper plate and copper conductor layers. The dielectric barrier interferes with the circuitry.

It is important to remove the epoxy resin smear before metallizing the holes. The prior art provides techniques for removing smear including mechanical means such as vapor honing which abrades or blasts the smear away or a secondary drilling operation with a slightly larger drill.

Chemical processes are the most commonly used methods for removing smear. Concentrated sulfuric acid (H2SO4) or chromic acid solutions are most commonly used to dissolve the epoxy resin smear. Plasma etching in vacuum chambers is also a technique which can be used for removing smear. British Pat. No. 1,479,556 discloses a process using alkaline potassium permanganate. Chemical means besides removing smear, can also provide an etchback by removing more of the epoxy resin from the hole walls thereby exposing the sides of the copper innerlayer in addition to the edge of the innerlayer, which etchback process some believe provides a more reliable plated thru-hole. FIG. 1 shows a cross section of a portion of an etched back hole showing the copper plate with resin on either side, the surface of which has been electrolessly copper plated.

When concentrated sulfuric acid is used to desmear and etchback the hole surface, a precipitate of dissolved resin may be formed on the surface. This is thought to happen because as the concentrated sulfuric acid is diluted by rinsing, it cannot maintain in solution as much resin which then precipitates out. This precipitate is known as etchback residue and must be removed prior to plating. Water rinses are usually not sufficient to do this. Aqueous solvents for the residue have been developed which effectively remove this residue and leave a clean surface on the hole wall as shown in FIG. 4.

Subsequent to the removal of etchback residue, conventional glass etchants may be used to remove protruding glass fibers prior to electroless plating. The protruding glass fibers without this etching may cause misplating or result in uneven metal coverage. Glass etching improves the ability of the glass to be plated and provides more even metal coverage.

SUMMARY OF THE INVENTION

In accordance with the present invention, subsequent to a conventional desmear and/or etchback process, the surface of the thru-holes are contacted with a solvent for any etchback residue and then contacted with a highly alkaline potassium permanganate solution, which two-step process increases the effective surface area of the hole surface by altering its topography, thereby providing improved coverage of the metal deposited on the hole surface. The two-step process is preferably used after a typical sulfuric acid desmear or etchback process. However, the improved results are not believed to be independent on the type of etchback and/or desmear treatment used. Various prior art desmearing and/or etchback processes may be used including plasma and chronic acid processes.

Electron microscopic examination of the thru-holes at various stages of processing showed that in a method in accordance with the invention, the surface topography of the hole surface was altered to provide a greater effective surface area. This surface topography was not found when either the solvent step or the potassium permanganate step was used without the other step.

BRIEF DESCRIPTION OF THE PHOTOGRAPHS

Figure 5:
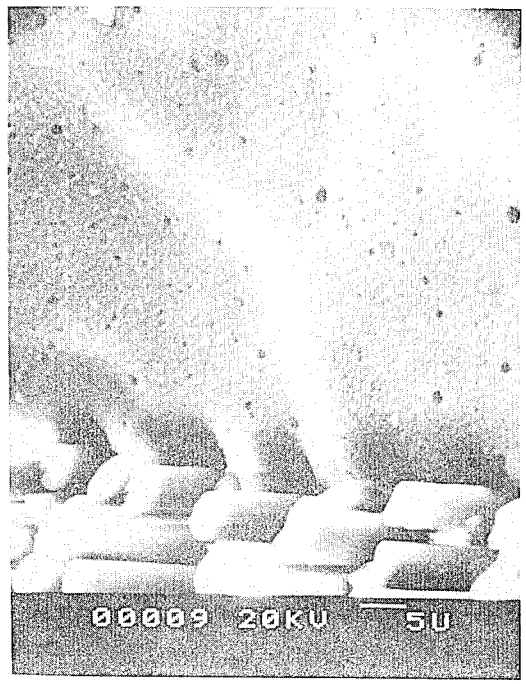
Figure 6:
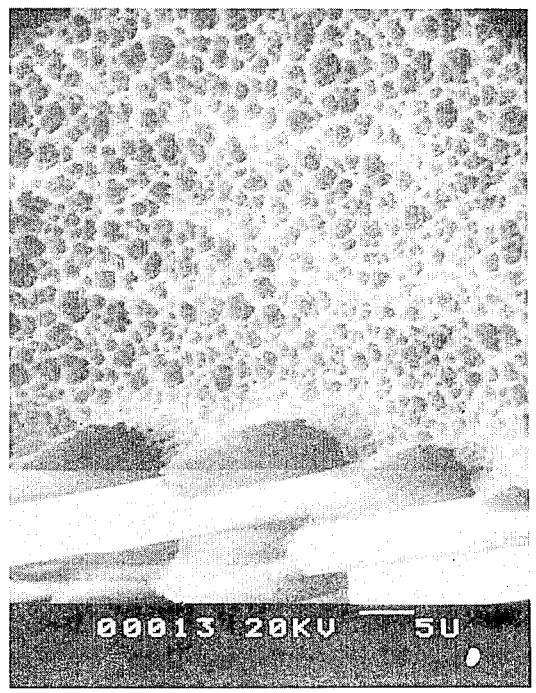

FIG. 5 is an electron micrograph taken at 2000× and shows the thru-hole surface with no solvent treatment but a treatment with highly alkaline potassium permanganate following the sulfuric acid etchback and desmear. The surface here is also smooth and glossy; and FIG. 6 is an electron micrograph taken at 2000× and shows the thru-hole surface after a sulfuric acid desmear, a solvent treatment, and a treatment with potassium permanganate, followed by a neutralizing and glass etching step. The effective surface area is increased.

DETAILED DESCRIPTION OF THE INVENTION

In accordance with the process of the present invention, the substrates used are epoxy resin glass multilayer laminates with copper innerlayers of the type used for printed circuit boards. These laminated substrates have drilled thru-holes which have epoxy resin smear thereon which must be removed prior to plating. The laminated substrates are first subjected to a conventional desmear and etchback process, either using sulfuric acid, chromic acid, plasma etching in vacuum chambers, or other known desmear and etchback processes. In the preferred form of the invention, a conventional sulfuric acid desmear and etchback process is used. Subsequent to the desmear and etchback process, the substrate is water rinsed.

In accordance with the invention, the substrates are then immersed in a solvent bath containing a solvent for the etchback residue, and more specifically a bath containing a solvent which is capable of removing remaining epoxy residue and provides for the changed topography when used with the permanganate treatment described below. Although many types of solvents may be used, depending upon the composition of the resin substrate, a preferred solvent bath containing 54.9% by weight butyl carbitol, 36.3% ethylene glycol and 8.8% of 50% rayon grade NaOH may be used. It should be understood that this solvent composition is given by way of example and that other solvents for the epoxy may be used. A solvent such as 90% dimethylformamide and 10% water may be used; a solvent containing 50% by volume dimethylformamide, and 50% by volume of the above described solvent bath; and a solvent containing a m-pyrol alone or in mixture with one or more of the above described solvents may be used. It should be understood, however, that the forgoing solvents are given by way of example only, and that other solvents may be used.

Immersion time of the substrate in the solvent may vary depending upon the bath temperature and the components of the solvent. It has been found that an immersion time of five minutes at a bath temperature of 140° F. provides acceptable results, alathough various immersion times and bath temperatures may be used. The substrates are then water rinsed to remove the residual solvent.

Subsequent to immersion in the solvent, the substrate is then immersed or contacted with a bath containing potassium permanganate. It is preferred that the potassium permanganate bath be highly alkaline, and have a pH in excess of 13, and most preferably 13.25. It is preferred that the bath contain highly concentrated potassium permanganate, and most preferably at least 30 grams per liter potassium permanganate. However, it should be understood that the concentration of potassium permanganate may be reduced if other parameters such as time and temperature are increased. The contact time with the bath may vary depending upon the bath temperature, the particular type of substrate being treated, and other variables. However, it has been found that an immersion time of greater than about two minutes is sufficient for baths having temperatures between about 140° and about 175° F. More particularly, it has been found that an immersion time of seven minutes at a bath temperature of 170° F. is suitable for practice of a process in accordance with the present invention.

After the substrate has been contacted with the alkaline potassium permanganate bath, the substrate is then ready for conventional steps of neutralizing and glass etching, followed by electroless copper plating.

The following examples illustrate the improved results obtained when using a method in accordance with invention wherein the substrate is first subjected to treatment with a solvent, and then treated with a potassium permanganate bath. The following examples are intended to illustrate, but do not limit the scope of the invention.

Example 1

An epoxy glass multilayer laminate with drilled thru-holes was subjected to a typical sulfuric acid desmear and etchback process wherein the laminate was dipped in a solution of 93% sulfuric acid for 20 seconds at room temperature and then water rinsed. The laminate was then immersed in a solvent bath containing 54.9% by weight butyl carbitol, 36.3% by weight ethylene glycol and 8.8% by weight of 50% rayon grade sodium hydroxide for five minutes at 140° F. The laminate was then rinsed withn water and immersed in a bath containing 50 grams per liter potassium permanganate which had been adjusted to a pH of 13.25 with sodium hydroxide. The laminate was immersed in the bath for six minutes at a bath temperature of 170° F., and then water rinsed.

The laminate was then neutralized by hydroxylamine hydrochloride and glass etched by sodium bifluoride.

A thru-hole was examined by a scanning electron microscope as shown in the electron micrograph of FIG. 6 taken at a power of 2000×.

Example 2

An epoxy glass multilayer laminate with drilled thru-holes was subjected to the process described in Example 1 with the exception that the solvent contact time was taken ten minutes rather than five minutes and the potassium permanganate contact time was seven minutes rather than six. Representative thru-holes were examined under the optical microscope and the surface of the thru-holes was found to be grainy in appearance.

The laminate was then electrolessly plated in a typical formaldehyde reduced copper bath. The plated thru-holes were examined under an optical microscope, and good metal coverage was observed.

Examples 3, 4 and 5

An epoxy glass multilayer laminate was subjected to a process in accordance with Example 2 with the exception that for each of the examples, a different solvent was used as follows:

Example 3—90% by volume dimethylformamide and 10% by volume water.

Example 4—50% by volume of 100% dimetylformamide, and 50% by volume of the solvent of Example 1.

Example 5—50% by volume of the solvent set forth in Example 1 and 50% by volume of 100% m-pyrol.

Representative thru-holes for each of the foregoing examples were examined under an optical microscope, and the surface of the thru-holes was found to be grainy in appearance.

The laminate was then electrolessly plated in a typical formaldehyde reduced copper bath. The plated thru-holes were examined under an optical microscope, and good metal coverage was observed.

COMPARATIVE EXAMPLE A

An epoxy glass multilayer laminate with drilled thru-holes was subjected to a process as described in Example 1 with the exception that the laminate was not treated in the potassium permanganate bath.

Figure 1:
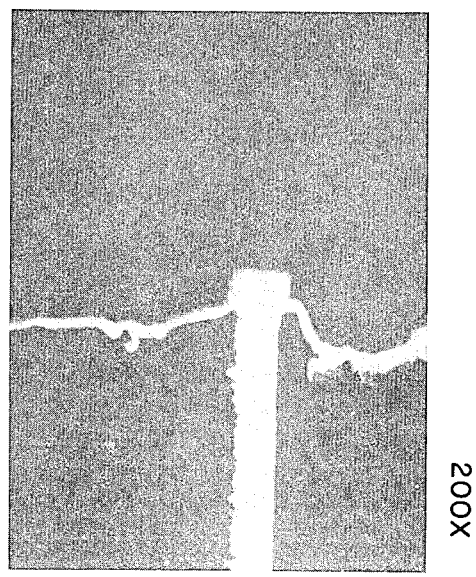
FIG. 1 is an electron micrograph taken at 200× of a cross section of an etched back hole and electrolessly copper plated.
Figure 2:
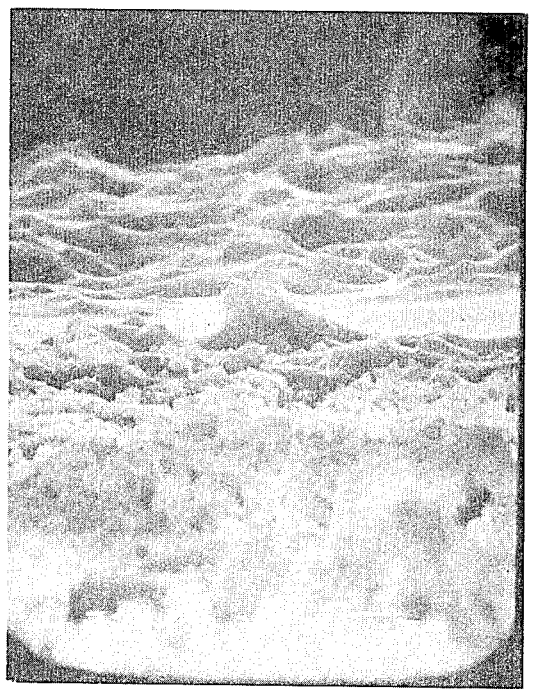
FIG. 2 is an electron micrograph taken at 2000× and shows the surface of a typical thru-hole drilled in an epoxy glass laminate before any treatment and subsequent to drilling.
Figure 3:
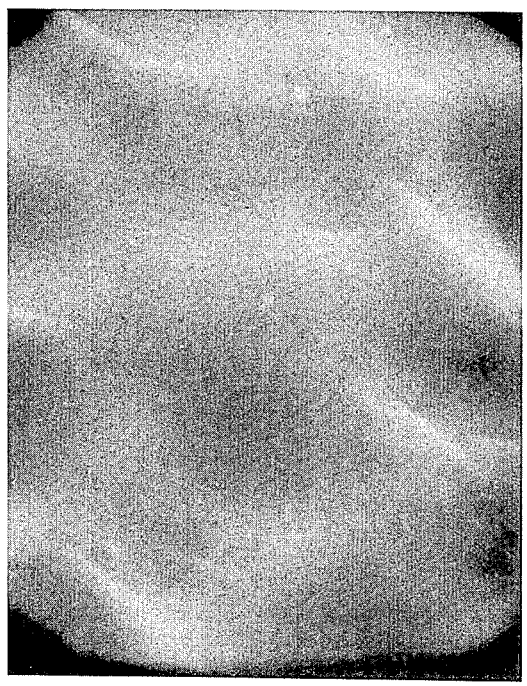
FIG. 3 is an electron micrograph taken at 4000× and shows the epoxy glass surface after a typical sulfuric acid desmear and etchback process wherein the surface is smooth and glossy.
Figure 4:
FIG. 4 is an electron micrograph taken at 2000× and shows the thru-hole surface with a solvent step that followed the sulfuric acid etchback and desmear process. The surface is smooth and glossy.

A thru-hole was examined by a scanning electron microscope as shown in the electron micrograph of FIG. 4 taken at a power of 2000×.

COMPARATIVE EXAMPLE B

An epoxy glass multilayer laminate with drilled thru-holes was subjected to a process as described in Example 2 with the exception that the laminate was not treated in the potassium permanganate bath. Optical microscopic examination of the thru-holes showed a glossy smooth epoxy surface. The laminate was then neutralized, glass etched, and electrolessly plated as in Example 1. The thru-holes were optically microscopically examined and massive blistering of metal was seen and poor metal coverage was observed.

COMPARATIVE EXAMPLE C

An epoxy glass multilayer laminate was processed sa set forth in Example 1, with the exception that the laminate was not treated with a solvent prior to the treatment with a potassium permanganate bath.

A thru-hole was examined by a scanning electron microscope as shown in the electron micrograph of FIG. 5 taken at a power of 2000×.

COMPARATIVE EXAMPLE D

An epoxy glass multilayer laminate was processed as set forth in Example 2, with the exception that the laminate was not treated with a solvent prior to the treatment with a potassium permanganate bath. The thru-holes were examined under an optical microscope and had a glossy smooth appearance prior to electroless copper plating. The laminate was then neutralized, glass etched, and electrolessly plated as described in Example 1 and hten examined under an optical microscope. The thru-holes showed poor metal coverage and heavy blistering of metal to the substrate.

From the foregoing examples and comparative examples, it can be seen that a process in accordance with the present invention alters the topography of the resin substrate surface, and more particularly provides a greater effective surface area. The greater effective surface area is believed to result in greater surface energy of the substrate for a more complete and even electroless metal deposition. From comparative examples A, B, C and D, it can be seen that if either the solvent step or the potassium permanganate step of the present invention is not used, the surface of the substrate is glossy and smooth afater the desmearing process and results in poor metal coverage in comparison with the metal coverage obtained in using a process in accordance with the invention.

It should be understood that although specific embodiments of the invention have been described herein in detail, such description is for purposes of illustration only anda modifications may be made thereto by those skilled in the art within the scope of the invention.

We claim:

1. A process for treating the surfaces of a thru-hole formed in a multilayer printed circuit board substrate, said substrate comprised of a conductive metal and insulating resin laminate having one or more conductive metal innerlayers, so as to condition said thru-hole surfaces for subsequent deposition of a conductive metal coating thereon, comprising the steps of:
   (a) subjecting said thru-hole to a desmearing process to remove resin material from exposed metal innerlayer surfaces in said thru-hole brought about by formation of the thru-hole;
   (b) thereafter contacting said thru-hole surfaces with a solvent which is capable of being absorbed by the resin; and
   (c) thereafter contacting said thru-hole surfaces with an alkaline permanganate solution having a pH in excess of 13.

2. A process for providing a full, smooth, adherent layer of conductive metal on the surfaces of a thru-hole formed in a multilayer printed circuit board substrate, said substrate being comprised of a conductive metal and insulating resin laminate having one or more innerlayes of said conductive metal, and wherein said thru-holes formed in said multilayer printed circuit board substrate have been previously subjected to a desmearing process to remove resin material fromexpose dmetal innerlayer surfaces in said thru-hole brought about by formation of the thru-hole, said process comprising the steps of:
   (a) contacting said thru-hole surfaces with a solvent which is capable of being absorbed by said resin;
   (b) thereafter contacting said thru-hole surfaces with an alkaline permanganate solution having a pH in excess of 13; and
   (c) thereafter electrolessly depositing a conductive metal layer onto said thru-hole surfaces.

3. The process according to either of claims 1 or 2 wherein said desmearing process comprises contact of said thru-hole surfaces with a solution comprising sulfuric acid.

4. The process according to either of claims 1 or 2 wherein said desmearing process comprises contact of said thru-hole surfaces with a solution comprising chromic acid.

5. The process according to either of claims 1 or 2 wherein said desmearing process comprises a mechanical desmearing process.

6. The process according to either of claims 1 or 2 wherein said solvent comprises m-pyrol.

7. The process according to either of claims 2 or 3 wherein said solvent comprises dimethylformamide.

* * * * *